United States Patent
Heilemann et al.

(10) Patent No.: US 10,797,414 B2
(45) Date of Patent: Oct. 6, 2020

(54) CABLE CONNECTOR FOR COAXIAL CABLE ON THICK PRINTED-CIRCUIT BOARD

(71) Applicant: Hirschmann Car Communication GmbH, Neckartenzlingen (DE)

(72) Inventors: Ingo Heilemann, Burgdorf (DE); Alexander Gelman, Stuttgart (DE); Rainer Stahl, Stuttgart (DE)

(73) Assignee: HIRSCHMANN CAR COMMUNICATION GmbH, Neckartenzlingen (DE)

( * ) Notice: Subject to any disclaimer, the term of this patent is extended or adjusted under 35 U.S.C. 154(b) by 0 days.

(21) Appl. No.: 16/302,317

(22) PCT Filed: Jul. 7, 2017

(86) PCT No.: PCT/EP2017/067069
§ 371 (c)(1),
(2) Date: Nov. 16, 2018

(87) PCT Pub. No.: WO2018/007580
PCT Pub. Date: Jan. 11, 2018

(65) Prior Publication Data
US 2019/0148853 A1 May 16, 2019

(30) Foreign Application Priority Data
Jul. 8, 2016 (DE) .......................... 10 2016 212 492

(51) Int. Cl.
*H01R 12/53* (2011.01)
*H01R 9/05* (2006.01)
(Continued)

(52) U.S. Cl.
CPC ............ *H01R 12/53* (2013.01); *H01R 4/027* (2013.01); *H01R 9/0515* (2013.01); *H01R 24/50* (2013.01);
(Continued)

(58) Field of Classification Search
CPC ........ H01R 9/05; H01R 9/0515; H01R 12/50; H01R 4/027; H05K 3/34
See application file for complete search history.

(56) References Cited

U.S. PATENT DOCUMENTS 5,532,659 A  7/1996  Dodart
5,737,687 A  4/1998  Martin et al.
(Continued)

FOREIGN PATENT DOCUMENTS

CN  102611472 A  7/2012
CN  203632629 U  6/2014
DE  102004060416 A  6/2006

*Primary Examiner* — Hoa C Nguyen
(74) *Attorney, Agent, or Firm* — Andrew Wilford

(57) ABSTRACT

Method for connecting a printed circuit board (1) to a coaxial cable (3), wherein the coaxial cable (3) has an internal conductor (5) which is surrounded by a dielectric (7) which, in turn, is surrounded by a shield (6), wherein the dielectric (7) is surrounded by an outer casing (4), wherein the internal conductor (5) is soldered to a contact point (8) on the printed circuit board (1) for the purpose of making electrical contact, characterized in that the printed circuit board (1) has a recess (2) which starts from the surface of said printed circuit board, and the end region of the outer casing (4) of the coaxial cable (3) is inserted at least partially into the recess (2).

11 Claims, 2 Drawing Sheets

(51) Int. Cl.
  *H01R 24/50* (2011.01)
  *H01R 4/02* (2006.01)
  *H01R 43/02* (2006.01)
  *H05K 1/11* (2006.01)
  *H05K 3/00* (2006.01)
  *H05K 3/34* (2006.01)

(52) U.S. Cl.
  CPC ......... *H01R 43/0263* (2013.01); *H05K 1/111* (2013.01); *H05K 3/0044* (2013.01); *H05K 3/34* (2013.01); *H05K 2201/09036* (2013.01); *H05K 2201/09145* (2013.01); *H05K 2201/10356* (2013.01)

(56) References Cited

U.S. PATENT DOCUMENTS

| | | | |
|---|---|---|---|
| 6,880,241 B2 | 4/2005 | Edwardsen | |
| 9,154,177 B2 | 10/2015 | Kim | |
| 2003/0043083 A1* | 3/2003 | Huang | H01Q 1/38 343/767 |
| 2004/0037516 A1* | 2/2004 | Torigoe | G02B 6/4201 385/92 |
| 2004/0057220 A1* | 3/2004 | Tamaki | H01P 5/085 361/760 |
| 2006/0022775 A1* | 2/2006 | Greeley | H01P 3/06 333/246 |

* cited by examiner

CABLE CONNECTOR FOR COAXIAL CABLE ON THICK PRINTED-CIRCUIT BOARD

CROSS REFERENCE TO RELATED APPLICATIONS

This application is the US-national stage of PCT application PCT/EP2017/067069 filed 07 Jul. 2017 and claiming the priority of German patent application 102016212492.7 itself filed 08 Jul. 2016.

FIELD OF THE INVENTION

The invention relates to a method of connecting a printed-circuit board to a coaxial cable.

BACKGROUND OF THE INVENTION

Such a coaxial cable has a core conductor surrounded by a dielectric inner sheath that, in turn, is surrounded by a shield, and the dielectric inner sheath is surrounded by an outer sheath. The core conductor is soldered to a contact point on the printed-circuit board for electrical contacting.

The direct connection of a coaxial cables to a printed-circuit board via a manual soldering procedure is imprecise and is not defined in the high frequency range. Continuous milling in the printed-circuit board material does not enable additional space-saving strain relief.

OBJECT OF THE INVENTION

The invention is therefore based on the object of improving a generic method.

SUMMARY OF THE INVENTION

According to the invention, the printed-circuit board is provided with a recess that starts from its face, and the end of the outer sheath of the coaxial cable is inserted at least partially into the recess. The positioning of the coaxial cable, in particular its end, is thus ensured in a defined and reproducible manner. The recess can be formed in the face of the printed-circuit board inward of the outer edge of the printed-circuit board. It is thereby possible to position the end of the coaxial cable with its core conductor (electrical conductor) precisely at the point where a contact point for the core conductor is located on the printed-circuit board for the electrical contacting of said core conductor. This means that it is conceivable to mount the end of the coaxial cable at any desired point inward of the outer edge of the printed-circuit board.

In a further development of the invention, the width of the recess is selected to be slightly smaller than the outer diameter of the outer sheath of the coaxial cable, and it is pressed at least partially into the recess. As a result of this geometrical adaptation of the coaxial cable to the recess formed in the printed-circuit board, a press fit is realized that, in addition to the reproducible arrangement of the end of the coaxial cable on the printed-circuit board, at the same time also effects strain relief after the pressing-in procedure.

In a further development of the invention, the recess is formed in the printed-circuit board starting from an edge of the printed-circuit board. The arrangement of the coaxial cable in the edge region of the printed-circuit board has the advantage that a cable exit is thus produced so that the printed-circuit board mounted within a housing, for example, and completely fills the base area of the housing. The space formed by the housing is thereby used optimally for the printed-circuit board so that the housing is able to accommodate as many electronic components as possible that are required for realizing the function of a corresponding electronic device. Moreover, by arranging the cable in the edge region of the printed-circuit board, it is easily possible to lead the coaxial cable out of a side wall of the housing. Such an electronic device is, for example, an antenna booster, in particular for mobile use in vehicles.

In a further development of the invention, the recess is formed in the printed-circuit board by means of a milling procedure. By means of a simple milling tool, the recess can therefore be formed in the printed-circuit board in a simple production step. The geometry of the milling tool thereby determines the contour of the recess so that, for example, angular, semicircular recesses (as seen in cross-section in each case) or other geometrical recesses can be achieved. The recess can be formed in the printed-circuit board by means of a single milling procedure, in which the milling tool is guided axially and forms the recess. Depending on the size and/or depth of the recess, it is also conceivable to move the milling tool back and forth axially and/or horizontally a plurality of times.

In a further development of the invention, the depth of the recess in the printed-circuit board is selected to be greater than at least half the outer diameter of the outer sheath of the coaxial cable. The outer sheath of the coaxial cable can thus be inserted with at least half of its outer diameter into the printed-circuit board so that a reproducible insertion procedure is ensured. It is of particular advantage in such a case that the width of the recess is selected to be slightly smaller than the outer diameter of the outer sheath of the coaxial cable in order to not only insert this deeply enough into the recess but also to secure it by means of press fit when the outer sheath of the coaxial cable is pressed into the prepared recess.

In a further development of the invention, the depth of the recess in the printed-circuit board is selected to be smaller than or equal to the thickness of the printed-circuit board. Thus, on the one hand, a sufficiently deep recess is provided that nevertheless, at the same time, does not impair the stability of the printed-circuit board in any way.

In a further development of the invention, a further contact point is present at least partially adjacent to the recess, to which contact point the shield of the coaxial cable is electrically connected, in particular soldered. As is already known from the prior art, the printed-circuit board has, on its surface, at least one contact point that serves to connect the core conductor of the coaxial cable electrically there, wherein this electrical connection can be a soldering procedure. In the case of coaxial cables that surround the electrical core conductor by means of a shield, it is often necessary for the shield to also be electrically contacted by the electronic device. In this case, it is of particular advantage according to the invention if the electrical contacting of the shield takes place by means of a further contact point on printed-circuit board. During the assembly of the coaxial cable and the electrical contacting thereof, it is therefore unnecessary to establish contact between the shield and other regions, for example a housing made from an electrically conductive material. The securing of the end of the coaxial cable and the electrical connection to the printed-circuit board takes place by means of the two contact points, of which one is associated with the core conductor and the other is associated with the shield. In particular, the electrical connection of both contact points, in one case to the shield and in one case to the core conductor, takes place by means of a soldering procedure.

In a further development of the invention, the recess and a partial region around it are provided with a cover. After the end of the coaxial cable has been secured on or laterally to the printed-circuit board, both the mechanical arrangement and the electrical contacting take place so that the function of the coaxial cable is accomplished in conjunction with the electronic device or its printed-circuit board. However, it is additionally possible to consider further equipping this region in which the coaxial cable is mechanically secured to, and in electrical contact with, the printed-circuit board with a cover that forms mechanical protection and/or electrical protection for the end of the coaxial cable in or on the printed-circuit board. Such a cover can moreover form strain relief either alone or in conjunction with the pressing-in of the end of the coaxial cable into the recess. If the cover is made from an electrically conductive material, it can be placed or pressed onto the outer sheath of the coaxial cable and/or its dielectric inner sheath in order to realize strain relief, for example. If the aim is to protect the electrically conductive regions (such as the contact point, core conductor and shield of the coaxial cable) against external influences, a cover made from an electrically non-conductive material, for example a plastics material, is possible.

It is possible to consider producing the cover from a liquid or viscous material and thereby covering the region of the end of the coaxial cable and the contact points therewith. A hot melt material, for example, is used in such a case.

As an alternative to this, it is provided in a further development of the invention that the cover is produced as a separate component and is secured to the printed-circuit board after the insertion of the coaxial cable into the recess and at least after the soldering of the core conductor to the contact partner on the printed-circuit board. This can take place in any suitable manner, for example by gluing, screwing, riveting, latching or the like. The cover can be produced as a separate component such that it can be mounted only on the one surface of the printed-circuit board. However, it can also be produced such that, after fastening the end of the coaxial cable in the edge region of the printed-circuit board, the cover reaches around this edge region so that the cover is secured on both surfaces of the printed-circuit board.

In a further development of the invention, the recess in the printed-circuit board has a length that corresponds to the sum of the length of the exposed core conductor, the length of the exposed dielectric inner sheath, the length of the exposed shield and the predetermined length of the outer sheath of the coaxial cable. The entire end of the coaxial cable with its exposed core conductor (for the purpose of establishing contact with the contact point) and the exposed shield (likewise for the purpose of establishing contact with the contact point on the printed-circuit board) and the outer sheath that is inserted, preferably pressed, into the recess, is dimensioned per this dimensional specification. The partial regions, in particular the exposed partial regions, are determined by the geometrical arrangement of the end of the coaxial cable (in particular for the purpose of reproducible securing) or by the electrical function (for example soldering the core conductor to the contact point on the printed-circuit board) or the high-frequency objective (attaching the shield of the coaxial cable to the contact point on the printed-circuit board for looping through of a continuous shield).

BRIEF DESCRIPTION OF THE DRAWING

An embodiment produced according to the method according to the invention is explained in more detail below and described with reference to the figures in which:

FIG. 3 shows the assembly of FIG. 3 in a perspective view;

SPECIFIC DESCRIPTION OF THE INVENTION

Figure 1:
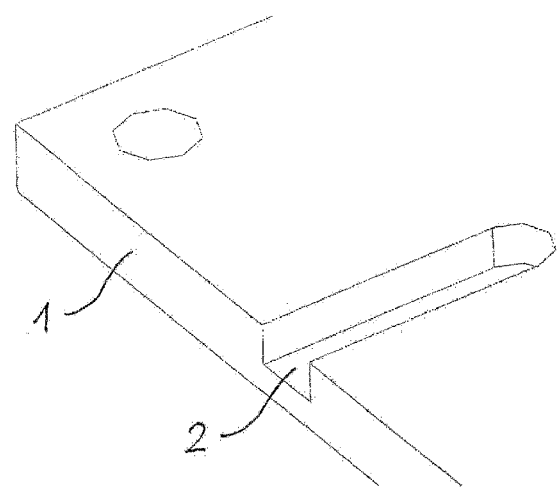
FIGS. 1 and 2 are perspective views of circuit boards for two respective embodiments of the invention.

FIG. 1 shows part of a printed-circuit board 1 of an electronic device not illustrated in more detail. Electrical and electronic components for realizing the function of the electronic device are mounted on the printed-circuit board 1 in a conventional manner. The printed-circuit board 1 is held inside a housing (not illustrated) of the electronic device. According to the invention, a recess 2 is formed in this printed-circuit board, starting from an edge of the printed-circuit board 1. The depth of the recess 2 corresponds approximately to half the thickness of the printed-circuit board 1. The recess 2 is milled by a stub-milling machine and has a predetermined length, a predetermined depth and a predetermined width. Its cross-section is approximately rectangular in this case.

Figure 2:
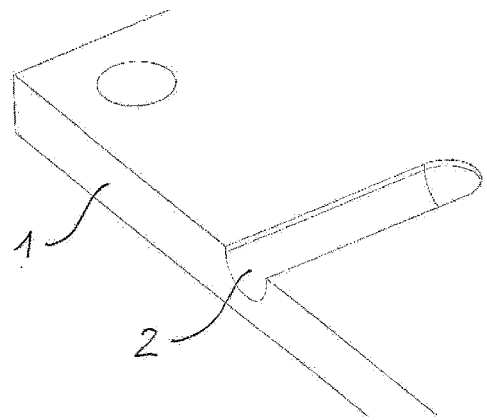

FIG. 2 shows an alternative configuration of the recess 2 milled into the printed-circuit board 1 by a ball-type milling machine. The recess 2 also has a predetermined width and a predetermined length and depth here, so a semicircular cross-section of the recess 2 is produced owing to the use of a ball-type milling machine.

Whereas FIGS. 1 and 2 show that, starting from the edge of the printed-circuit board 1, each recess 2 extends inward and can also be milled into the surface of the printed-circuit board 1 within the inner region of the printed-circuit board 1 and thereby at a spacing from the edge of the printed-circuit board 1.

Figure 3:
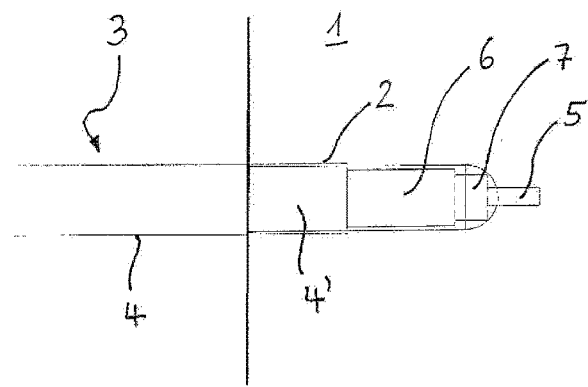
FIG. 3 is a top view of the assembly of circuit board and coaxial cable.

FIG. 3 shows, in a plan view of the printed-circuit board 1 from above, the arrangement of an appropriately prepared coaxial cable 3 in the recess 2.

Figure 4:
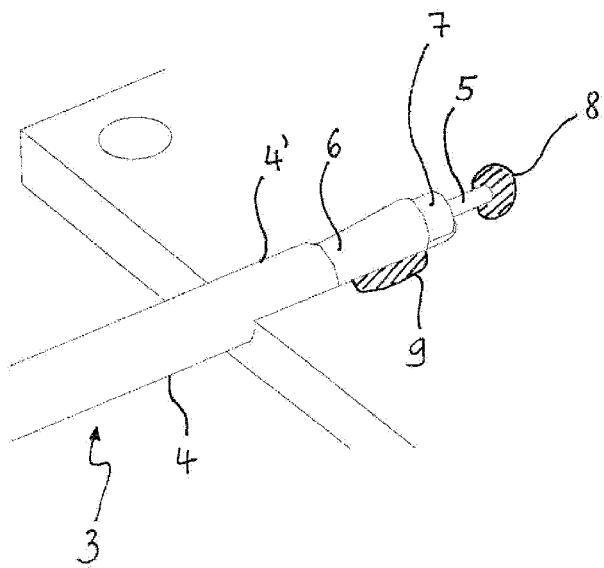
FIG. 4 is a partly sectional end view of the invention with a cover on one face of the circuit board.

FIG. 4 shows the same structure as in FIG. 3, but in a perspective view of the printed-circuit board 1 from the side.

Common to the embodiments according to FIGS. 3 and 4 is that the coaxial cable 3 has an outer sheath 4 in a manner known per se, and a core conductor 5 (for example an electrically conductive wire) coaxially inside it. A shield 6, for example a foil or a mesh made from aluminum, is located beneath the outer sheath 4. So that the electrically conductive shield 6 does not come into contact with the core conductor 5, a dielectric inner sheath 7, for example made from a plastics material, is provided between the core conductor 5 and the shield 6. Such a construction of the coaxial cable 3 is essentially known.

The correspondingly prepared end of the coaxial cable 3 is inserted into the recess 2 that was previously formed in the printed-circuit board 1. For this purpose, the core conductor 5 is exposed by removal of the outer sheath 4, the shield 6 and the dielectric inner sheath 7 to a predetermined length.

The dielectric inner sheath 7 is then exposed in that the shield 6 surrounding it and the outer sheath 4 are removed. Moreover, the shield 6 is exposed to a predetermined length in that the outer sheath 4 is removed. The thus-prepared end of the coaxial cable is then fitted into the recess 2 in such a way that an end of the outer sheath 4 shown at 4' in FIGS. 3 and 4, is inserted, in particular pressed, into the recess. As a result of the outer diameter of the core conductor 5 and the shield 6 and the dielectric inner sheath 7 being smaller than the width or depth of the recess 2, these regions of the coaxial cable 3 are at a spacing from the recess 2.

FIG. 4 shows that there is on of the printed-circuit board 1 at least one contact point 8 (also referred to as a solder pad), preferably precisely one contact point, and at least one contact point 9, preferably one contact point 9, on the one side of the recess 2 or two contact points are present on both sides of the recess 2 on the surface of the printed-circuit board 1. The core conductor 5 and/or the shield 6 of the coaxial cable 3 are electrically contacted via these contact points 8, 9, for example as a result of a soldering procedure.

It can be seen in particular in FIG. 4 that the end of the outer sheath 4 shown at 4' is provided with its longitudinal axis approximately in the longitudinal axis of the recess 2, and the longitudinal axes of the core conductor 5, the shield 6 and the dielectric inner sheath 7 are offset from this longitudinal axis of the recess 2. This means that the end of the coaxial cable is bent slightly upward to ensure that the core conductor 5 can lie on the contact point 8.

Figure 5:
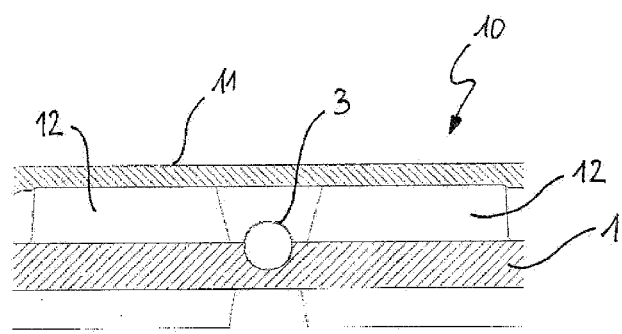
FIG. 5 is a section perpendicular to that of FIG. 6 of the invention with the cover on both faces of the circuit board.
Figure 6:
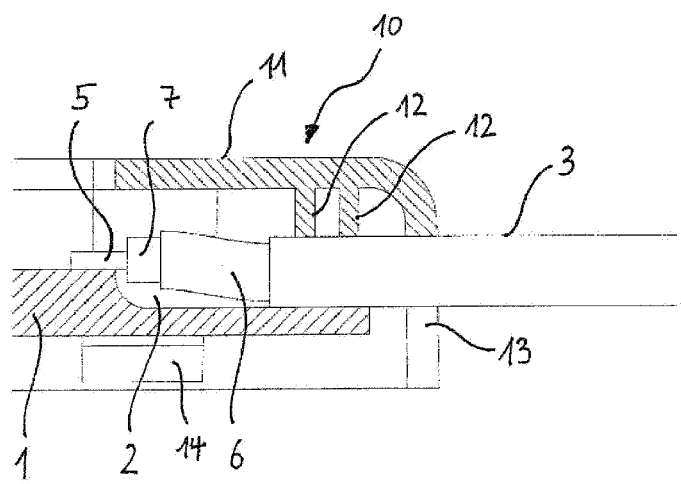

In FIGS. 5 and 6, a cover 10 is illustrated that covers the end of the coaxial cable 3 in the recess 2. In one variant, the cover 10 is mounted only on one face of the printed-circuit board 1. However, it is also conceivable for the cover 10 to be symmetrical, or deviate from a symmetrical configuration on both faces of the printed-circuit board 1.

In the embodiment according to FIGS. 5 and 6, the cover 10 is provided asymmetrically on both faces of the printed-circuit board 1.

The cover 10 comprises an upper side 11 that has a web 12 (or a plurality of webs 12, as can be seen in FIG. 6) extending toward the face of the printed-circuit board 1. A front web 13 can be present, but does not have to be present, which front web is aligned parallel to the lateral edge of the printed-circuit board 1 from which the recess 2 starts (FIG. 6). The upper side 11 of the cover 10 covers at least the parts of the coaxial cable 3 inserted into the recess 2, but preferably also extends beyond them.

To secure the cover 10, it has, in a suitable manner, a latch hook 14 (possibly also more than one latch hook 14), that secures the cover 10 to the printed-circuit board 1.

In the illustrated embodiment of the cover 10, the front web 13 has an opening for the coaxial cable, so that it is not only conceivable to secure the cover 10 by its at least one latch hook 14 latching against the printed-circuit board 1, but alternatively to push the cover 10 onto the printed-circuit board 1, to which end the latch hook 14 is formed as a guide element. Primarily, the at least one web 12 that acts (in particular presses) on the end of the outer sheath 4 serves for mechanical securing and thereby, in an advantageous manner, strain relief.

Whereas the cover 10 illustrated in FIGS. 5 and 6 is produced as a separate component and then assembled, it is conceivable to protect the region of the recess 2, with the coaxial cable 3 arranged and contacted therein, by a potting compound, for example, and to possibly also thus achieve strain relief.

A brief, paraphrased description of the invention follows:

1 Problem

The direct assembly of coaxial cables on printed-circuit board material via a manual soldering procedure is imprecise and is not defined in the high frequency range. Continuous milling in the printed-circuit board material does not enable additional space-saving strain relief.

2 Solution Principle

By partially milling a suitable thick printed-circuit board to approximately half the cable diameter, the cable end can be positioned in a defined manner on the printed-circuit board and the electrical conductor of the cable can be soldered in a defined manner to a contact point, in particular to an end of a trace on the printed-circuit board. In addition, the partial milling of the printed-circuit board furthermore enables a mechanical counter-pressure of an add-on part against the cable sheath for strain relief.

3 Implementation

The printed-circuit board is milled to the length of the bared dielectric inner sheath of the coaxial cable. The milling width corresponds to the diameter of the coaxial line. The milling depth corresponds approximately to the external radius of the coaxial line, and it should be ensured here that the milling depth is sufficient to hold the width of the coaxial cable tightly in the printed-circuit board. At the milling edge, solder pads are applied laterally level with the bared cable shield in order to ensure the ground connection of the coaxial cable. The projecting core conductor is soldered to a further solder pad. A cover is preferably additionally used that has at least one rib that, in the assembled state, fits around the coaxial line from above and additionally fixes it in the milled recess.

4 Sequence

1) The milled recess is taken into account in the printed-circuit board design
2) The coaxial cable is inserted into the milled portion during cable connection
3) The cable is inserted flush so that the dielectric inner sheath abuts the end of the milled portion
4) The cable is held in the milled portion by a holding device
5) The cable is soldered
6) Strain relief is ensured by a holding device on an add-on part

5 Use

Assembly of antennae that:
demands precise processes owing to the high frequencies are soldered automatically
must ensure strain relief on the cable
By partially milling a suitable thick printed-circuit board to approximately half the cable diameter, the cable end can be mounted in a defined manner on the printed-circuit board and the electrical conductor of the cable can be soldered in a defined manner to a contact point, in particular to an end of a trace, on the printed-circuit board.

---

List of references

1 Printed-circuit board
2 Recess
3 Coaxial cable
4 Outer sheath
5 Core conductor
6 Shield

| List of references | |
|---|---|
| 7 | Dielectric inner sheath |
| 8 | Contact point |
| 9 | Contact point |
| 10 | Cover |
| 11 | Upper side |
| 12 | Web |
| 13 | Front web |
| 14 | Latch hook |

The invention claimed is:

1. A method of connecting a first contact point on a face of a printed-circuit board having an outer edge to a coaxial cable having a core conductor surrounded by a dielectric inner sheath surrounded by a conductive shield surrounded by an outer sheath, the method comprising the steps of sequentially:
    milling in the board adjacent between the contact point and the outer edge a recess opening at the face and of a semicircular shape of a diameter less than an outer diameter of the outer sheath;
    forming a second contact point in the recess;
    stripping the inner sheath, outer shield, and outer sheath from an end of the cable to expose an end of the core conductor;
    stripping the outer sheath outward of the exposed end of the core conductor to expose the outer shield;
    pressing the end of the cable into the recess in a form fit and thereby engaging the exposed core-conductor end with the first contact point and the exposed shield with the second contact point; and
    electrically attaching the exposed core-conductor end and the exposed shield to the respective contact points.

2. The method according to claim 1, wherein the width of the recess is slightly smaller than an outer diameter of the outer sheath of the coaxial cable and the end of the cable is pressed at least partially into the recess.

3. The method according to claim 1, wherein the recess is formed in the printed-circuit board starting from the outer edge of the printed-circuit board.

4. The method according to claim 1, wherein a depth of the recess in the printed-circuit board is set to be greater than at least half an outer diameter of the outer sheath of the coaxial cable.

5. The method according to claim 1, wherein a depth of the recess in the printed-circuit board is selected to be smaller than a thickness of the printed-circuit board.

6. The method according to claim 1, further comprising the step of:
    providing the recess and a partial region around the recess with a cover.

7. The method according to claim 6, wherein the cover is a separate component and is secured to the printed-circuit board after insertion of the coaxial cable into the recess and at least after electrically attaching the core conductor to the contact point on the printed-circuit board.

8. The method according to claim 1, wherein the recess in the printed-circuit board has a length that corresponds to a sum of a length of the exposed core conductor, a length of the exposed dielectric inner sheath, a length of the exposed shield and a partial length of the outer sheath of the coaxial able.

9. The method defined in claim 1, wherein the exposed core-conductor end and the exposed shield are electrically attached to the respective contact points by soldering.

10. The method defined in claim 1, wherein the shield is electrically attached to the further contact point by soldering.

11. A connection assembly between a coaxial cable and a printed-circuit board made according to the method of claim 1.

* * * * *